United States Patent
Wang et al.

(10) Patent No.: US 7,639,501 B2
(45) Date of Patent: Dec. 29, 2009

(54) HEAT SINK ASSEMBLY HAVING A CLIP

(75) Inventors: Yi-Can Wang, Shenzhen (CN); Cui-Jun Lu, Shenzhen (CN); Xin-Jian Wang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/051,857

(22) Filed: Mar. 20, 2008

(65) Prior Publication Data

US 2009/0237885 A1    Sep. 24, 2009

(51) Int. Cl.
*H05K 7/20* (2006.01)
*H01L 23/36* (2006.01)

(52) U.S. Cl. .............. 361/704; 361/710; 361/715; 361/719; 165/80.3

(58) Field of Classification Search ......... 361/700–712, 361/715, 717–724, 727, 728, 732, 753, 794, 361/816, 818; 174/15.1, 16.3, 252; 257/706–727; 165/80.2, 80.3, 80.4, 80.5, 104.33, 104.34, 165/185, 121–122; 24/453, 457, 458, 625, 24/588, 589, 981; 29/890.02, 890.03, 515, 29/832; 411/511, 516, 530; 248/316.7, 505, 248/506, 510
See application file for complete search history.

(56) References Cited

U.S. PATENT DOCUMENTS

| | | | | |
|---|---|---|---|---|
| 5,386,338 A | * | 1/1995 | Jordan et al. | 361/704 |
| 5,579,205 A | * | 11/1996 | Tustaniwskyj et al. | 361/704 |
| 5,590,025 A | * | 12/1996 | Clemens | 361/695 |
| 5,640,305 A | * | 6/1997 | Smithers | 361/719 |
| 6,118,659 A | * | 9/2000 | Adams et al. | 361/704 |
| 6,392,866 B1 | * | 5/2002 | Dinteman | 361/206 |
| 6,424,530 B1 | * | 7/2002 | Lee et al. | 361/704 |
| 6,449,154 B1 | * | 9/2002 | Yoneyama et al. | 361/704 |
| 6,496,371 B2 | * | 12/2002 | Winkel et al. | 361/703 |
| 6,590,771 B2 | * | 7/2003 | Sopko et al. | 361/704 |
| 6,644,387 B1 | * | 11/2003 | Lee et al. | 165/80.3 |
| 6,717,814 B2 | * | 4/2004 | Li | 361/704 |
| 6,803,652 B2 | * | 10/2004 | Winkel et al. | 257/706 |
| 6,947,283 B2 | * | 9/2005 | Hsieh et al. | 361/703 |
| 7,203,066 B2 | * | 4/2007 | Lee et al. | 361/704 |
| 7,333,338 B2 | * | 2/2008 | Lai et al. | 361/715 |
| 7,382,622 B2 | * | 6/2008 | Li et al. | 361/719 |
| 7,417,860 B2 | * | 8/2008 | Yang et al. | 361/710 |
| 7,508,674 B2 | * | 3/2009 | Li et al. | 361/704 |
| 7,518,874 B2 | * | 4/2009 | Deng et al. | 361/710 |

* cited by examiner

*Primary Examiner*—Michael V Datskovskiy
(74) *Attorney, Agent, or Firm*—Frank R. Niranjan

(57) ABSTRACT

A heat sink assembly includes a heat sink and a clip. The heat sink includes a base and a plurality of fins extending upwardly from a top surface of the base. The clip includes a pressing body, two bending portions slantwise to the pressing body and extending from two opposite ends of the pressing body, and two locking arms extending from two ends of the bending portions. The pressing body of the clip abuts against the top surface of the base. The bending portions are extended downwardly from the pressing body to be located adjacent to two sides of the base to prevent the clip from moving horizontally along a lateral direction of the heat sink.

10 Claims, 3 Drawing Sheets

HEAT SINK ASSEMBLY HAVING A CLIP

BACKGROUND OF THE INVENTION

1. Field of the Invention

The present invention relates to a heat sink assembly, and more particularly to a heat sink assembly having a heat sink and a clip, wherein the clip can reliably secure the heat sink on an electronic device, and wherein when the clip is assembled to the heat sink, a horizontally lateral movement of the clip relative to the heat sink is effectively prohibited.

2. Description of Related Art

Advances in microelectronics technology have resulted in electronic devices which process signals and data at unprecedented high speeds. During operation of many contemporary electronic devices such as central processing units (CPUs), solid-state circuits, and light emitting diode (LED) display units, large amounts of heat are produced. This heat must be efficiently removed to prevent the system from becoming unstable or being damaged.

Typically, a heat sink assembly is used to cool the electronic device. The heat sink assembly comprises a heat sink attached to an outer surface of the electronic device to facilitate removal of heat therefrom and a clip for fastening the heat sink to the electronic device. The heat sink includes a base and a plurality of fins extending from the base. A channel is defined between every two adjacent fins. The clip extends through one of the channels and abuts against a top surface of the base, with two ends thereof locked on a printed circuit board on which the electronic device is mounted to provide pressure for securing the heat sink on the electronic device.

In the heat sink assembly mentioned above, the clip can firmly secure the heat sink on the electronic device along a perpendicular direction. However, the clip does not have a mechanism for effectively preventing the heat sink from a lateral movement, which results in a possible horizontal movement of the clip relative to the heat sink when the heat sink assembly is subject to vibration. The horizontal movement of the heat sink assembly lowers the heat dissipation effectiveness achievable by the heat sink.

What is needed, therefore, is a heat sink assembly having a heat sink and a clip locked on the heat sink, wherein the clip can reliably secure the heat sink in position so that the heat sink will not have a horizontally lateral movement relative to the heat sink.

SUMMARY OF THE INVENTION

A heat sink assembly includes a heat sink and a clip. The heat sink includes a base and a plurality of fins extending upwardly from a top surface of the base. The clip includes a pressing body, two bending portions slantwise to the pressing body and extending from two opposite ends of the pressing body, two extension portions extending from two ends of the bending portions, and two locking arms perpendicularly extending from two ends of the locking arms. The pressing body of the clip is received in a groove between two neighboring ones of the fins and abuts against the top surface of the base. The bending portions of the clip are extended downwardly from the pressing body to be located adjacent to two sides of the base. The bending portions are provided for preventing the clip from moving horizontally along the groove. When a force is applied to the clip to cause it to move horizontally along the groove, the bending portions will abut against a side of the base to prevent the horizontal movement of the clip.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
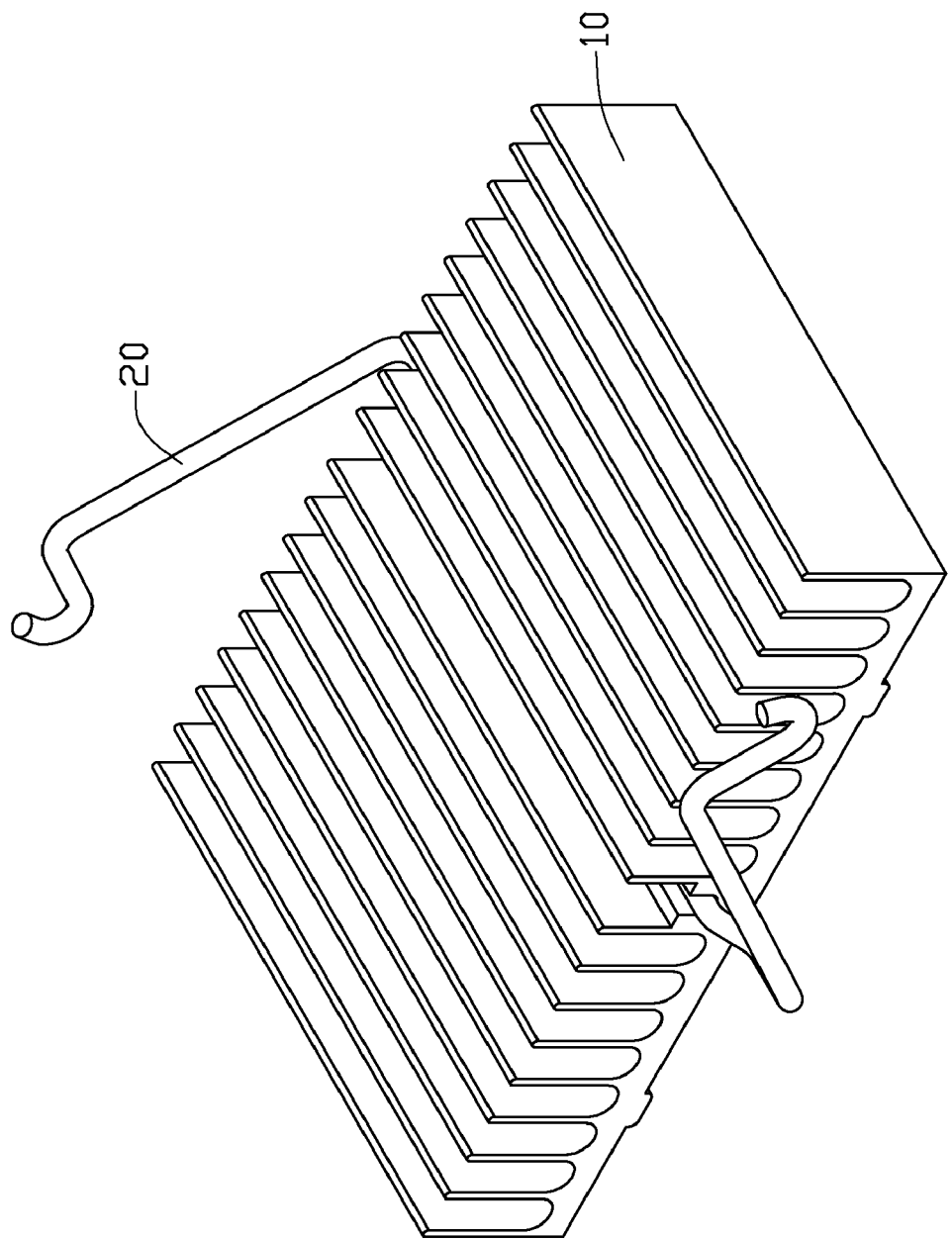
FIG. 1 is an isometric, assembled view of a heat sink assembly in accordance with a preferred embodiment of the present invention.
Figure 2:
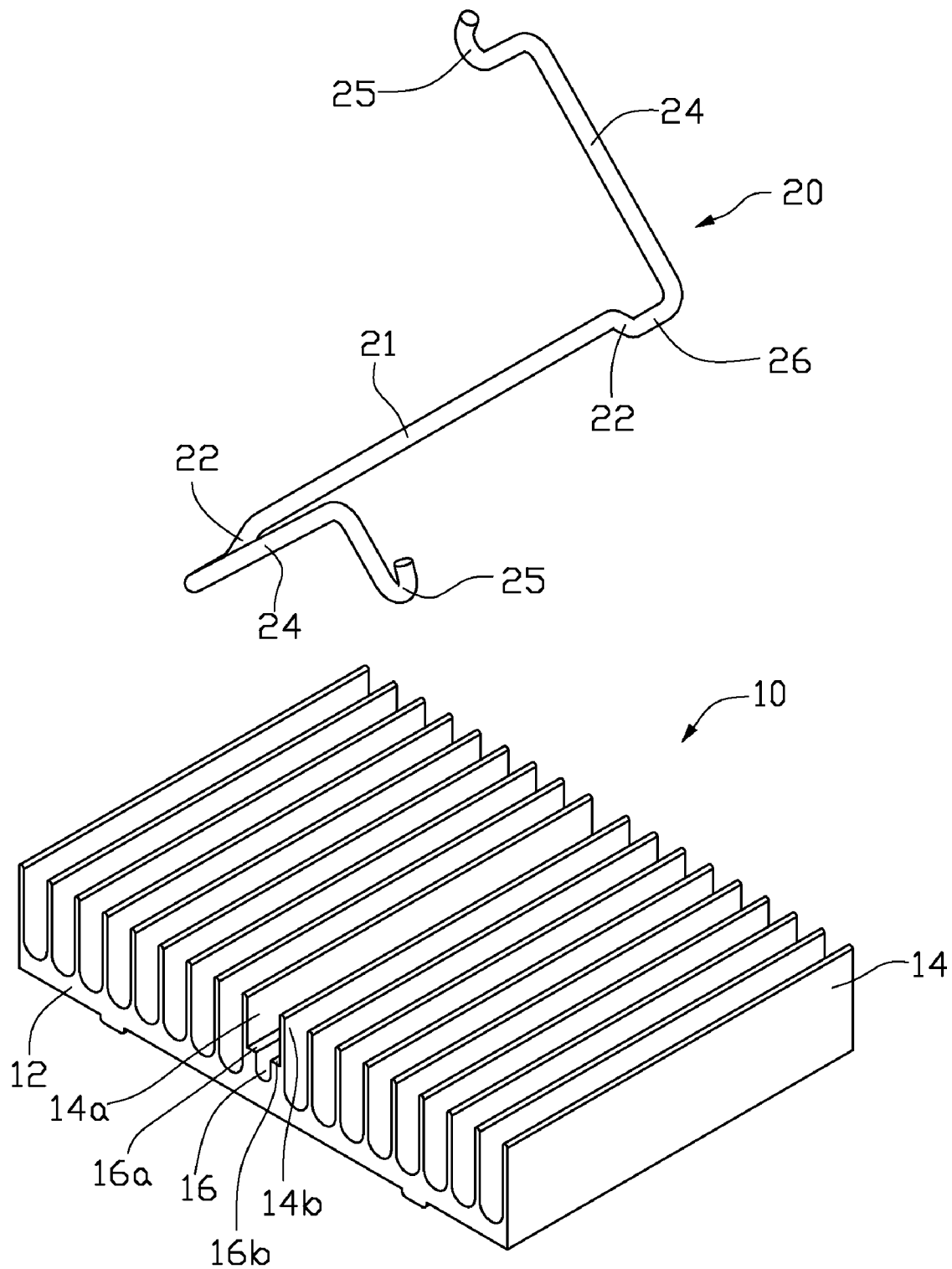
FIG. 2 is an isometric, exploded view of the heat sink assembly of FIG. 1.

Referring to FIGS. 1-2, a heat sink assembly, which is adapted for dissipating heat generated from an electronic element (not shown) on a printed circuit board (not shown), comprises a heat sink 10 and a clip 20. The clip 20 is used to secure the heat sink 10 onto the printed circuit board whereby the heat sink 10 can have an intimate contact with the electronic element.

The heat sink 10 is integrally made of metal with a high heat conductivity such as copper, aluminum or an alloy thereof. The heat sink 10 comprises a rectangular base 12 and a plurality of fins 14 extending upwardly from a top surface of the base 12. The fins 14 are parallel to each other and parallel to two short sides of the base 12. A channel (not labeled) is defined between every two adjacent fins 14. Two protrusions 16a, 16b facing towards each other are formed at lower portions of two adjacent fins 14a, 14b which are located at a center of the heat sink 10. The protrusions 16a, 16b at the center of the heat sink 10 define a straight groove 16 therebetween, for receiving the clip 20 therein. A width of the groove 16 is smaller than a gap between top portions of the fins 14a, 14b. Strength of the lower portions of the fins 14a, 14b is reinforced by the protrusions 16a, 16b.

The clip 20 is a wire clip which is integrally made of a resilient metal wire. The clip 20 comprises a pressing body 21, two bending portions 22 bent from two opposite ends of the pressing body 21 and slantwise relative to the pressing body 21, two extension portions 26 bent respectively from free ends of the bending portions 22, and two locking arms 24 extending respectively from free ends of the extension portions 26. A hook 25 is formed on a free end of each of the locking arms 24.

Figure 3:
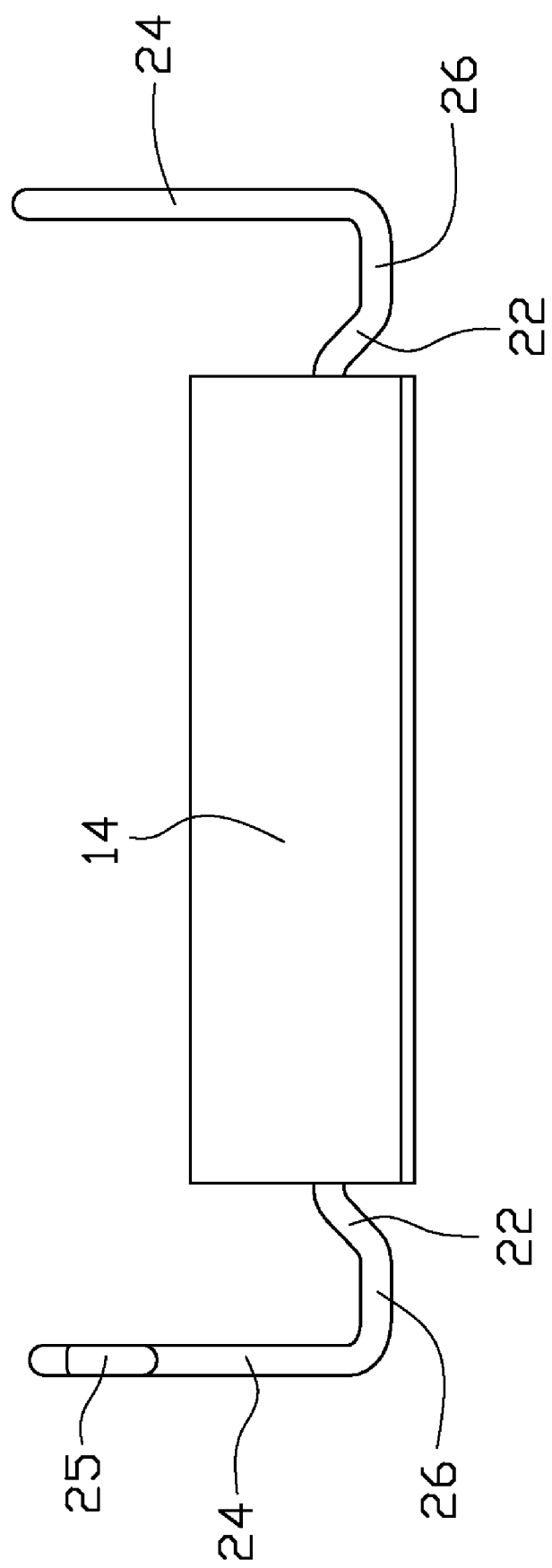
FIG. 3 is a side elevational view of the heat sink assembly of FIG. 1.

The pressing body 21 is straight and has a length similar to a width of the base 12 of the heat sink 10 (clearly seen from FIG. 3) and a length of the groove 16. The pressing body 21 is fitly received in the groove 16 of the base 12. Two bending portions 22 extend downwardly from two opposite ends of the pressing body 21 and are symmetric to the pressing body 21. The extension portions 26 extend horizontally from free ends of the bending portions 22. The extension portions 26 are parallel to the pressing body 21, and are symmetric to the pressing body 21. The extension portions 26 have a certain length to provide an operation space for the locking arms 24, thereby preventing the locking arms 24 from interfering with the heat sink 10 when the locking arms 24 are bent downwardly to connect with printed circuit board. A perpendicular distance between the extension portions 26 and the pressing body 21, i.e., a perpendicular height of the bending portions 22, is substantially identical to a height of the base 12. The bending portions 22 extend downwardly from the pressing body 21 to be adjacent to two long sides of the base 12. When the clip 10 is forced to move horizontally along a lateral (i.e. right-to-left or left-to-right) direction of the heat sink 10 due to vibration, the bending portions 22 will engage with the two long sides of the base 12 to prevent the clip 20 from moving horizontally along the lateral direction of the heat sink 10, as viewed from FIG. 3. Therefore, a steady locking force of the clip 20 is provided and a tight attachment of the heat sink 10 to the electronic element is obtained, to guarantee a desired heat dissipation efficiency of the heat sink 10. The feature that the clip 20 is prevented from moving laterally when the pressing body 21 is received in the groove 16 also ensures that the clip 20 will not shift from its intended assembled position whereby the clip 20 can be more conveniently locked to the printed circuit to help a quick assembly of the heat sink 10 to the printed circuit board and the electronic component.

The locking arms 24 extend upwardly from free ends of the extension portions 26. The locking arms 24 are perpendicular to the extension portions 26. The two locking arms 24 extend towards different directions, whereby the locking arms 24 and their respective extension portions 26 are respectively in different planes. The hooks 25 extend upwardly from the free ends of the locking arms 24. Each hook 25 and each corresponding locking arm 24 are coplanar. The hooks 25 are used to lock into clasps (not shown) on the printed circuit board to secure the heat sink 10 onto the printed circuit board.

In assembly, the pressing body 21 of the clip 20 extends through the fins 14a, 14b and is pivotably engaged in the groove 16 of the heat sink 10; then, the hooks 25 are locked into the clasps on the printed circuit board. Since the pressing body 21 is straight, the clip 20 can be rotated forwardly or rearwards freely to facilitate the hooks 25 to be locked into the clasps. The pressing body 21 is fitly received in the groove 16 of the heat sink 10 to prevent the clip 20 from moving horizontally along a front-to-rear or rear-to-front direction as viewed from FIG. 3. Furthermore, the bending portions 22 of the clip 20 can prevent the clip 20 from moving horizontally along the laterally right-to-left or left-to-right direction as viewed from FIG. 3. Thus, the clip 20 can provide a steady locking force to maintain a tight attachment of the heat sink 10 to the electronic element, thereby to enable the heat sink 10 to have a satisfied heat dissipation effect.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly, comprising:
a heat sink comprising a base and a plurality of fins extending from a top surface of the base; and
a clip comprising a pressing body abutting against the top surface of the base, two bending portions extending downwardly from two opposite ends of the pressing body and located adjacent to two sides of the base, and two locking arms extending from two ends of the bending portions;
wherein the pressing body of the clip is straight; and
wherein the clip further comprises an extension portion between each of the bending portions and a corresponding one of the locking portions, and the extension portion is parallel to the pressing body of the clip.

2. The heat sink assembly as claimed in claim 1, wherein a perpendicular height of the bending portions of the clip is identical to a height of the base of the heat sink.

3. The heat sink assembly as claimed in claim 1, wherein a hook is formed at a free end of each of the locking arms of the clip.

4. The heat sink assembly as claimed in claim 1, wherein the fins of the heat sink are parallel to each other, and a groove is defined between two fins at a center of the base of the heat sink for receiving the pressing body of the clip.

5. The heat sink assembly as claimed in claim 4, wherein a length of the pressing body of the clip is similar to that of the groove of the heat sink.

6. The heat sink assembly as claimed in claim 4, wherein two protrusions facing towards each other are formed at lower portions of the two fins at the center of the base.

7. The heat sink assembly as claimed in claim 1, wherein the locking arms are perpendicular to the extension portion.

8. A clip adapted for locking a heat sink, comprising a pressing body for abutting against the heat sink, two bending portions extending downwardly from two opposite ends of the pressing body, two extension portions extending horizontally from two ends of the bending portions, two locking arms extending perpendicularly from two free ends of the extension portions and two hooks formed at two ends of the locking arms, wherein the two bending portions are used to engage with two sides of the heat sink to prevent the clip from moving horizontally along a lateral direction of the heat sink.

9. The clip as claimed in claim 8, wherein the pressing body is straight and the extension portions are parallel to the pressing body.

10. A heat sink assembly comprising:
a heat sink having a base and a plurality of fins extending upwardly from the base;
a clip having a pressing body received in a channel between two adjacent fins, a pair of bending portions extending downwardly from two opposite ends of the pressing body to be located adjacent to two opposite sides of the base of the heat sink and two locking arms connecting with the two bending portions, adapted for fastening with a printed circuit board, wherein the bending portions are provided for preventing the clip from having a lateral movement along the channel;
wherein the heat sink has two protrusions extending inwardly from lower portions of the two adjacent fins toward each other, the pressing body of the clip being received between the protrusions; and
wherein the clip has two extension portions each being located between a corresponding bending portion and a corresponding locking arm, the each extension portion being parallel to the pressing body.

* * * * *